(12) United States Patent
Kloppenburg

(10) Patent No.: US 9,476,909 B2
(45) Date of Patent: Oct. 25, 2016

(54) TEST TERMINAL BLOCK

(71) Applicant: Phoenix Contact GmbH & Co. KG, Blomberg (DE)

(72) Inventor: Christian Kloppenburg, Büren Wewelsburg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 192 days.

(21) Appl. No.: 14/395,592

(22) PCT Filed: Sep. 4, 2013

(86) PCT No.: PCT/EP2013/068210
§ 371 (c)(1),
(2) Date: Oct. 20, 2014

(87) PCT Pub. No.: WO2014/037358
PCT Pub. Date: Mar. 13, 2014

(65) Prior Publication Data
US 2015/0077149 A1  Mar. 19, 2015

(30) Foreign Application Priority Data

Sep. 4, 2012  (DE) .................. 10 2012 017 429

(51) Int. Cl.
| | |
|---|---|
| *H01R 9/26* | (2006.01) |
| *G01R 1/04* | (2006.01) |
| *H01R 31/08* | (2006.01) |
| *H01R 13/629* | (2006.01) |

(52) U.S. Cl.
CPC .............. *G01R 1/0416* (2013.01); *H01R 9/26* (2013.01); *H01R 9/2666* (2013.01); *H01R 31/08* (2013.01)

(58) Field of Classification Search
CPC .... H01R 9/26; H01R 9/2608; H01R 9/2616; H01R 9/2666; H01R 9/2675; H01R 13/629; H01R 13/62905; H01R 13/62911; H01R 13/62916; H01R 13/62922; H01R 13/62827
See application file for complete search history.

(56) References Cited

U.S. PATENT DOCUMENTS

| 5,330,366 | A | * | 7/1994 | Tsuji | .................. | H01R 13/633 |
| | | | | | | 439/352 |
| 6,332,800 | B2 | * | 12/2001 | Kodama | ................... | 439/357 |
| 6,945,801 | B2 | * | 9/2005 | Brown | ................ | H01R 13/641 |
| | | | | | | 439/188 |
| 7,666,037 | B2 | | 2/2010 | Diessel | | |

FOREIGN PATENT DOCUMENTS

| DE | 10 2005 025 108 B3 | 7/2006 |
| DE | 10 2006 052 894 A1 | 5/2008 |

* cited by examiner

*Primary Examiner* — Amy Cohen Johnson
*Assistant Examiner* — Matthew T Dzierzynski
(74) *Attorney, Agent, or Firm* — David S. Safran

(57) ABSTRACT

A test terminal block is formed of a series terminal block and a test plug block pluggable onto the series terminal block and fastening clamps for releasably securing them together. Each of two fastening clamps has a clamp housing contains at least two catch elements and the housing of each has at least two corresponding mating catch elements that determine two interlocking positions of fastening parts in the fastening clamps, one position is arranged after the other in the plug-on direction of the fastening parts. An unlocking element is movably arranged in the housing of each of the two fastening parts, which unlocking element can be brought into a first unlocking position and a second unlocking position, the locking of the first interlocking position being released in the first unlocking position and the locking of the second interlocking position being released in the second unlocking position by the unlocking element.

17 Claims, 13 Drawing Sheets

TEST TERMINAL BLOCK

BACKGROUND OF THE INVENTION

1. Field of the Invention

The invention relates to a test terminal block formed of a modular terminal block and a test plug block which can be clipped onto the modular terminal block, the modular terminal block having a plurality of modular terminals which are located next to one another and on both sides of the plurality of modular terminals one fastening clamp at a time, the test plug block having a plurality of tests plugs which are connected to one another and on both sides of the plurality of test plugs one fastening part at a time, the two fastening parts being connected to one another via a handle, each modular terminal having two busbars which together form an isolating point and each test plug having a contact plug which can be plugged into a isolating point, and the two fastening clamps each having a clamp housing with a guide groove and the two fastening parts each having a housing with a corresponding guide section which can be plugged into a guide groove. In addition, the invention relates to a module composed of a fastening clamp and a fastening part which can be connected to a test plug block for use in a test terminal block.

2. Description of Related Art

Electrical modular terminals have been known for decades and are being used in the millions in the wiring of electrical systems and devices. The terminals are generally locked onto mounting rails which for their part are often located in a plurality in a switching cabinet. Mainly screw terminals or tension spring terminals are used as conductor connecting elements. The clamping principle in tension spring terminals is similar to that of screw technology. While in the screw terminal, a tension sleeve draws the conductor against the busbar by the actuation of the terminal screw, in the tension spring terminal this task is assumed by the tension spring. But in addition insulation piercing connecting devices or torsion spring terminals can also be used.

In switching, measuring and control technology feed-through terminals with a disconnect possibility are the standard. The disconnect possibility which is implemented in the electrical modular terminal, i.e., the isolating point which is provided in the busbar, makes it possible here to plug different plugs with different functions into the terminal housing of the modular terminal, which plugs then make contact with the busbar at the isolating point. In addition to simple isolating plugs or through connectors, in particular, test plugs can also be used as plugs and can have special components, and they enable checking of the proper operation of the circuit which is connected to the modular terminal.

Electrical modular terminals which are generally made wafer-shaped, are often mated to several other electrical modular terminals to form a modular terminal block and are locked onto a mounting rail or mounted in a wall cutout, for example, of a switching cabinet. Accordingly, the individual test plugs, which correspond in their width generally to the width of the modular terminals, are joined into a test plug block and are seated jointly on a corresponding modular terminal block. In this case, there is the requirement that the number of interconnected modular terminals and the number of test plugs which are combined with one another into a test plug block can be freely selected. But at the same time the test plugs which have been combined into a test plug block should be able to be jointly actuated as simply as possible, i.e., should be able to be clipped jointly on the modular terminal block.

German Application 10 2005 025 108 B3 discloses a device for testing of a protective, measuring or counting apparatus, for example, of a protective line relay which has a pole strip which can be connected to the electrical apparatus with several successively arranged pole openings and a plug block with a number of pole tongues which corresponds to the number of pole openings. An individual pole strip module of the pole strip consists of a housing in which there are two contact tubes for connection of lines and spring-loaded contact clips which are connected to the contact tubes. The two contact clips can make contact by the pole tongue of a plug, the pole tongue of the plug having two pole segments which are separated from one another by a barrier. The barrier together with the corresponding pole opening in the pole strip module forms polarization which ensures that only one plug with a certain pole tongue can be inserted into a certain pole opening of a pole strip.

In the unplugged state of the plug or pole tongue into the pole strip, the two contact clips make contact with one another so that the two contact tubes are connected to one another in an electrically conductive manner and current can flow via a connected pole strip. If the plug with its pole tongue is pushed completely into the pole opening, the two contact clips are electrically separated from one another and the current flow is routed via the plug so that a test process can be carried out.

German Patent Application DE 10 2006 052 894 A1 and corresponding U.S. Pat. No. 7,666,037 B2 disclose a modular terminal, a test plug and a test plug block which consists of a plurality of modular terminals which are located next to one another and a corresponding number of test plugs, the individual modular terminals and the individual test plugs being similar in basic principle to the pole strip modules and pole plugs which are known from German Patent Application DE 10 2005 025 108 B3.

By using two fastening clamps and two fastening parts which are each located on the two sides of the modular terminal block or of the test plug block, the number of modular terminals and the number of test plugs which can be combined into a modular terminal block and a test plug block can be freely selected. The two fastening parts are connected to one another via a handle so that the test plug block together with the two fastening parts can be easily and comfortably plugged or clipped into the modular terminal block and the two fastening clamps using the handle. The handle is located on the top end of the fastening parts which have a larger cavity than the test plugs so that the handle spans the test plugs which are located between the two fastening parts and in this way can be comfortably grasped with one hand.

In order to ensure defined contact states when the test plug is plugged into the test opening, in the electrical modular terminal which is known from DE 10 2006 052 894 A1 and corresponding U.S. Pat. No. 7,666,037 B2, the busbars are made such that they form two contact regions which are located in succession in the direction in which the test plug is clipped on. In the known modular terminals thus the isolating point which is formed by the one end regions of the busbars is made in two stages. By forming a defined second contact region which is located in the insertion direction of the contact plug upstream of the first contact region, it is ensured that when the contact plug is inserted first a reliable electrical connection occurs between the contact plug and the two busbars before the first contact region is opened as the contact plug continues to be inserted, as a result of which the two busbars are then electrically separated from one another.

It is common to the above described known modular terminals and test plug blocks that the two busbars make contact with one another so that the conductor connecting elements are connected to one another in an electrically conductive manner when a plug has not been inserted into the modular terminal. If conversely a plug has been (completely) plugged into the modular terminal, the contact region is disconnected so that the conductor connecting elements are also electrically separated from one another.

Often, the individual test plugs of the test plug block have contact plugs of different length. When the test plug block is clipped on, then first the longer contact plugs of individual test plugs are immersed into the corresponding openings in the terminal housing of the modular terminals and make contact there with the leading contact region of the two busbars which is the first in the clip-on direction of the test plug. If the test plug block continues to be plugged onto the modular terminal block, the longer contact plugs are immersed into the second contact region, as a result of which this contact region is opened so that the electrically conductive connection between the two busbars—and thus also between the two conductor connecting elements which are connected to the busbars—is interrupted. If the contact plugs are electrically conductive, in this way, current conduction is bypassed via the test plug. When the test plug block continues to be plugged onto the modular terminal block, next the shorter contact plugs make contact first accordingly with the leading contact region in the modular terminals before the shorter contact plugs also open the second contact region, and in this way, also the current conduction of these modular terminals is interrupted and if necessary bypassed via the test plugs.

When the test plug block is pulled out of the modular terminal block, in many applications, it is necessary or at least desirable that the longer contact plugs still disconnect the contact region of the assigned modular terminals, while the shorter contact plugs are already pulled out of the second contact region of the assigned modular terminals so that the two busbars of the corresponding modular terminal again make contact, as a result of which current conduction via the modular terminal takes place. But here, in the known test terminal blocks, there is the risk that by pulling the test plug block out of the modular terminal block too quickly or too unevenly, the above described sequence is not reliably or properly ensured, after which the contact regions of some modular terminals are still opened by the longer contact plugs, while via other modular terminals to which test plugs with shorter contact plugs are assigned a current transition is already taking place. In this way, an unstable or undefined electronic state of individual modular terminals of the modular terminal block can arise.

SUMMARY OF THE INVENTION

The object of this invention is to devise a test terminal block in which the above described disadvantages are avoided. Moreover, preferably, pulling the test plug block out of a modular terminal block is to be as simple and comfortable as possible for the user.

This object is achieved in a test terminal block of the initially described type in that the clamp housing of the two fastening clamps has at least two latch elements each and the housing of the two fastening parts has at least two corresponding mating latch elements each, the latch elements and the mating latch elements together fixing two latching positions of the fastening parts in the fastening clamps, which positions are located in succession in the clip-on direction of the fastening parts or of the test plug.

In accordance with the invention, by the execution of the latch elements and the corresponding mating latch elements, thus a first latching position and a second latching position are implemented, as a result of which the test plug block can be locked both in its completely clipped-on position and also in a second, partially withdrawn position. The second latching position can ensure that the test plug block, first of all, is pulled out of the modular terminal block only so far that shorter contact plugs of individual test plugs no longer open the contact regions of the assigned modular terminals, while the contact regions of other modular terminals are still opened by the longer contact plugs of the test plugs which are assigned to these modular terminals.

In order to enable intentional unlocking of the two latching positions, one unlocking element at a time is movably arranged in the housing of the two fastening parts and can be moved into a first and into a second unlocking position, in the first unlocking position the locking of the first latching position and in the second unlocking position the locking of the second latching position being released by the unlocking element. If the unlocking element is moved into the first unlocking position, the locking between the latch elements and the mating latch elements of the first latching position is therefore released, so that the test plug block can be pulled somewhat out of the first modular terminal block. Since pulling the test plug block out of the modular terminal block is limited by the second latching position, for completely pulling the test plug block out of the modular terminal block first the unlocking element must be moved into the second unlocking position, as a result of which the second latching position is released so that then the test plug block can be pulled completely out of the modular terminal block.

According to a first, especially advantageous configuration of the invention, the unlocking element is made and located within the housing of the fastening part such that the lower edge of the unlocking element sits in the first unlocking position on the top of the clamp housing of the fastening clamp, and that the unlocking element can be moved further out of this first unlocking position in the clip-on direction of the fastening part into a third position, as a result of which the housing of the fastening part is repelled from the clamp housing of the fastening clamp. Due to this configuration of the unlocking element, it acts not only to unlock the two latching positions, but moreover also as an ejection aid or withdrawal aid when the test plug block is being pulled out of the modular terminal block.

In particular, when a test terminal block has a somewhat larger number of modular terminals and test plugs, relatively high pulling forces can result from the individual spring forces of the isolation points in the modular terminals when the test plug block is being pulled out of the modular terminal block. These pulling forces which are to be applied manually by the user can be reduced by the above described preferred configuration of the test plug block in accordance with the invention since the housing of the fastening part is repelled from the clamp housing of the fastening clamp—and thus, also the individual test plugs from the individual modular terminals—when the unlocking element is moved further out of the first unlocking position in which it already sits on the top of the clamp housing of the fastening clamp into the third position. The unlocking element thus supports the user when the test plug block is being pulled out of the modular terminal block so that the user need apply still less force for this purpose.

According to another advantageous configuration of the test terminal block in accordance with the invention, the latch elements in the clamp housing of the fastening clamps are made as latch clips and the mating latch elements on the housing of the fastening parts are made as corresponding latch hooks. The at least one latch clip of the first latching position and the at least one latch clip of the second latching position are preferably located on opposite sides of the clamp housing and in different planes in the clip-on direction of the fastening parts.

The two latching positions which are located in succession in the clip-on direction can be easily implemented by the arrangement of the latch clips in different planes in the clip-on direction of the fastening parts. The arrangement of the latch clips on opposite sides of the clamp housing enables simple release of the two latching positions without the release of the first latching position influencing the second latching position.

The latch hooks on opposite sides on the housing of the fastening parts are arranged corresponding to the arrangement of the two latch clips on the two opposite sides of the clamp housing. Here, the latch hooks can also be located in different planes in the clip-on direction of the fastening part; however, this is not absolutely essential to achieve the two latching positions since they can also be fixed solely by the arrangement of the latch clips in two planes.

It was stated above that there is at least one latch clip or at least one latch hook for the two latching positions in the clamp housing of the fastening clamps and on the housing of the fastening parts. Especially reliable and stable latching in the two latching positions can be achieved by there being in the clamp housing of the fastening clamps two latch clips at a time on the two sides of the clamp housing, then also corresponding thereto on the two sides of the housing of the fastening parts there being latch hooks. The latch clips on one side of the clamp housing are preferably connected to one another via a segment, to release the two latching positions one segment at a time being deflected by the unlocking element. A deflection of a segment then leads to the bordering latch clips likewise being somewhat deflected and in this way no longer engaging the assigned latch hooks so that the latching position or the latching is released and the fastening parts or the test plug block can be pulled partially or out of the fastening clamps and the modular terminal block—out of the first latching position into the second latching position—or completely out In order to facilitate the release of the two latching positions, it is preferably provided that each of the unlocking elements have an actuating section on their sides facing the segments. Here, the first actuating section which is used to unlock the first latching position tapers in the clip-on direction of the fastening part, while the second actuating section which is used to unlock the second latching position tapers against the clip-on direction of the fastening part. The two actuating sections thus each have an insertion bevel, the two insertion bevels being inclined opposite one another.

According to another especially preferred configuration of the invention, the unlocking elements in the housing of the two fastening parts are moved by a rotary motion of the handle. This makes it possible for the unlocking of the two latching positions and the withdrawal of the test plug block from the modular terminal block to take place with only one hand, and moreover, without grasping peripherally. The unlocking by means of a rotary motion of the handle takes place preferably in three steps which can be carried out easily and comfortably in succession with one hand:

In a first step, by turning the handle by an angle $\alpha$ in a first direction, the unlocking elements in the housing of the two fastening parts are moved out of a base position, in which the fastening parts in the first latching position are latched in the fastening clamps, into the first unlocking position.

In the second step, by continuing to turn the handle by an angle $\beta$ in the same direction, the unlocking elements are moved into the third position, as a result of which the fastening parts are repelled from the fastening clamps.

In the third step, the handle is turned back into the base position, as a result of which the unlocking elements are moved into the second unlocking position.

The angles $\alpha$ and $\beta$ by which the handle is turned in the two first steps are chosen here such that the turning of the handle by the operator can take place easily and comfortably with one hand. Therefore, it is advantageous if the handle need not be turned too much farther in the two steps, preferably together less than 180°, especially less than 120°, for example, roughly 90°. The angles $\alpha$ and $\beta$ can be essentially the same, for example, 45° each. But, it is also possible for the two angles $\alpha$ and $\beta$ to be different, for example, the angle $\alpha$ to be roughly 20°-40° and the angle $\beta$ to be roughly 50°-70°.

This two-stage turning of the handle by less than 120° can be done very easily and comfortably with one hand without the necessity of grasping it peripherally. Because the handle must be turned back again to move the unlocking elements into the second unlocking position, and thus, to release the second latching position, moreover, it is ensured that the test plug block is not unintentionally pulled completely out of the modular terminal block by turning the handle too far and by pulling vigorously one time on the handle.

In order to convert the rotary motion of the handle into straight-line motion of the unlocking elements, in the housing of the two fastening parts, there is preferably a respective gearing arrangement via which each of the two unlocking elements are connected to the handle. Preferably, each of the gearing arrangements has two gears and a connecting rod, one end of which is connected to one gear and the other end of which is connected to an unlocking element. By a suitable choice of the two gears, of which one is connected to one end of the handle, advantageous multiplication of the force can be achieved. This is advantageous especially with respect to the additional operation of the unlocking elements as an ejection aid or withdrawal aid when the test plug block is being pulled out of the modular terminal block. In this way, the force which must be applied to move the unlocking elements into the third position in which the housing of the fastening parts is repelled from the clamp housing of the fastening clamps and thus the shorter test plugs are pulled out of the elastic contact regions, can remain relatively small, even for a test terminal block with a plurality of modular terminals and a plurality of test plugs.

It was stated at the beginning that the test plug block has a plurality of test plugs which are connected to one another and has a respective fastening part on the two sides of the plurality of test plugs. The mechanical connection of the individual test plugs among one another takes place preferably by the housing of the test plugs on the sides facing one another having latch recesses and latch pins which correspond to one another. There are preferably latch pins on one side of the housing and latch recesses on the opposite side corresponding to the latch pins of the bordering test plug.

Accordingly, the two fastening parts are also mechanically connected to the test plugs by means of latch pins or latch recesses which are made or arranged on the housing of the fastening parts.

An additional mechanical connection or fixing of the test plug block takes place via the handle which is connected, for example, screwed, to the two fastening parts. Moreover, alternatively or preferably, additionally, a mechanical connection of the test plug block can also be ensured via a threaded rod which is pushed through the two fastening parts and all test plugs and is screwed to a nut on an outer side of a fastening part. This ensures that the test plug block forms a very stable unit which can be easily clipped onto the modular terminal block or can be withdrawn from the modular terminal block.

The fastening clamps are also preferably mechanically connected to the modular terminals, on the fastening clamps there likewise being latch pins and/or latch recesses and in the side wall of the terminal housing of the modular terminals, there being correspondingly made latch recesses or latch pins. Since the modular terminals are often locked onto a mounting rail, latching of the modular terminals among one another or also to the fastening clamps is however not absolutely necessary. Moreover, in place of the latch pins and the latch recesses also other latch elements can be formed on the fastening clamps and the modular terminals or on the fastening parts and the test plugs.

The two-stage latching which is provided in accordance with the invention is especially advantageous when the contact plugs of the individual test plugs have different lengths, the individual contact plugs of the test plugs having especially two different lengths, even if this invention is not limited thereto.

In addition to the above described test terminal block, the invention also relates to a module composed of a fastening clamp and a fastening part which can be connected to a test plug block for use in a corresponding test terminal block. The initially named object is achieved in this module in that the clamp housing of the fastening clamp has at least two latch elements and the housing of the fastening part has at least two corresponding mating latch elements, the latch elements and the mating latch elements together fixing two latching positions of the fastening part in the fastening clamp, which positions are located in succession in the clip-on direction of the fastening part. As already mentioned in conjunction with the test terminal block, in accordance with the invention, moreover, in the housing of the fastening part an unlocking element is movably arranged which can be moved into a first unlocking position and into a second unlocking position, in the first unlocking position the locking of the first latching position and in the second unlocking position of the locking of the second latching position being released by the unlocking element.

With respect to the advantages of the arrangement and execution of the latch elements and of the mating latch elements and of the unlocking element in the housing of the fastening part, reference is made to the above in conjunction with the test terminal block in accordance with the invention. In the module, the latch elements are preferably made as latch clips and the mating latch elements are made as latch hooks, the preferably two latch clips of the first latching position and the preferably two latch clips of the second latching position being located on opposite sides of the clamp housing and in different planes in the clip-on direction of the fastening part.

Further advantageous configurations of the module in accordance with the invention, such as for example, the arrangement of a gearing arrangement in the housing of the fastening part as well as a host of other possibilities for embodying and developing the test terminal block and the module in accordance with the invention will become apparent from the following description of a preferred exemplary embodiment in conjunction with the drawings.

DETAILED DESCRIPTION OF THE INVENTION

Figure 1:
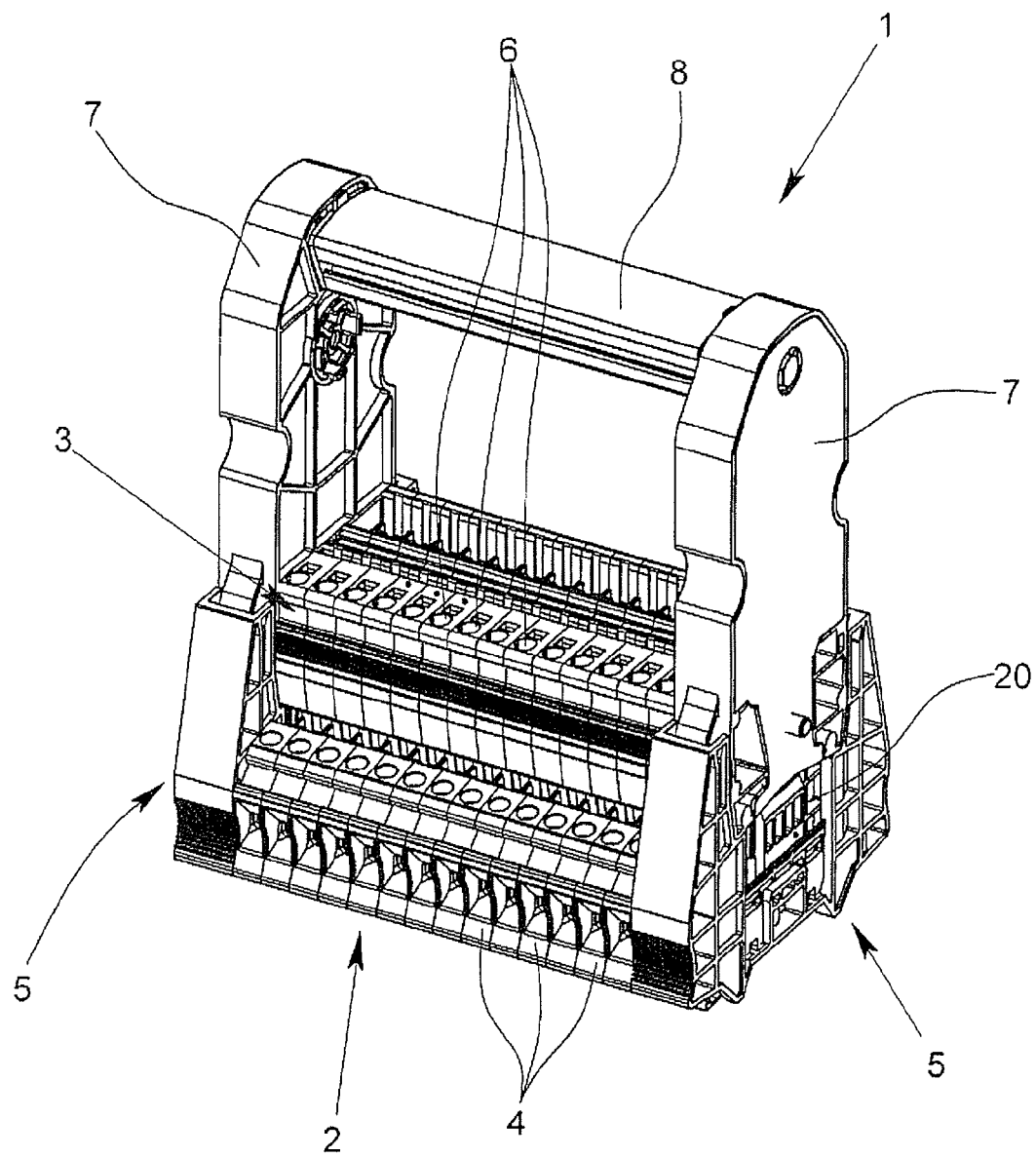
FIG. 1 a perspective view that shows a test terminal block in accordance with the invention in the completely plugged-in state.

The test terminal block 1 which is shown as a whole in FIG. 1 comprises a modular terminal block 2 and a test plug block 3 which can be plugged onto the modular terminal block 2. The modular terminal block 2 is formed of a plurality of modular terminals 4 which are located next to one another and two fastening clamps 5 which are located on the two sides of the plurality of modular terminals 4. Accordingly, the test plug block 3 comprises a plurality of interconnected test plugs 6 and two fastening parts 7 which are located on opposite sides of the plurality of test plugs 6. Moreover, the test plug block 3 has a handle 8 via which the two fastening parts 7 are connected to one another, the height of the two fastening parts 7 being much greater than the height of the test plugs 6 so that the handle 8 which is located on the top end of the fastening parts 7 can be comfortably grasped by one hand of an operator.

The individual modular terminals 4 each have two busbars 9, 9' which together form an isolation point into which a contact plug 10 of a test plug 6 can be plugged (see, FIG. 13). Moreover, each of the individual modular terminals 4 have two conductor connecting elements to which a respective first end region of each busbar 9, 9' is assigned. When the contact plug 10 is not plugged in, the two busbars 9, 9' make contact with one another at the isolating point so that the conductor connecting elements are connected to one another in an electrically conductive manner. Conversely, if a contact plug 10 is plugged completely into the modular terminal 4 or the isolating point, the contact region is disconnected so that the conductor connecting elements are electrically separated from one another. Since the specific structure of the individual modular terminals 4 is not the focus of this invention, they are not shown in further detail in the figures.

Figure 2:
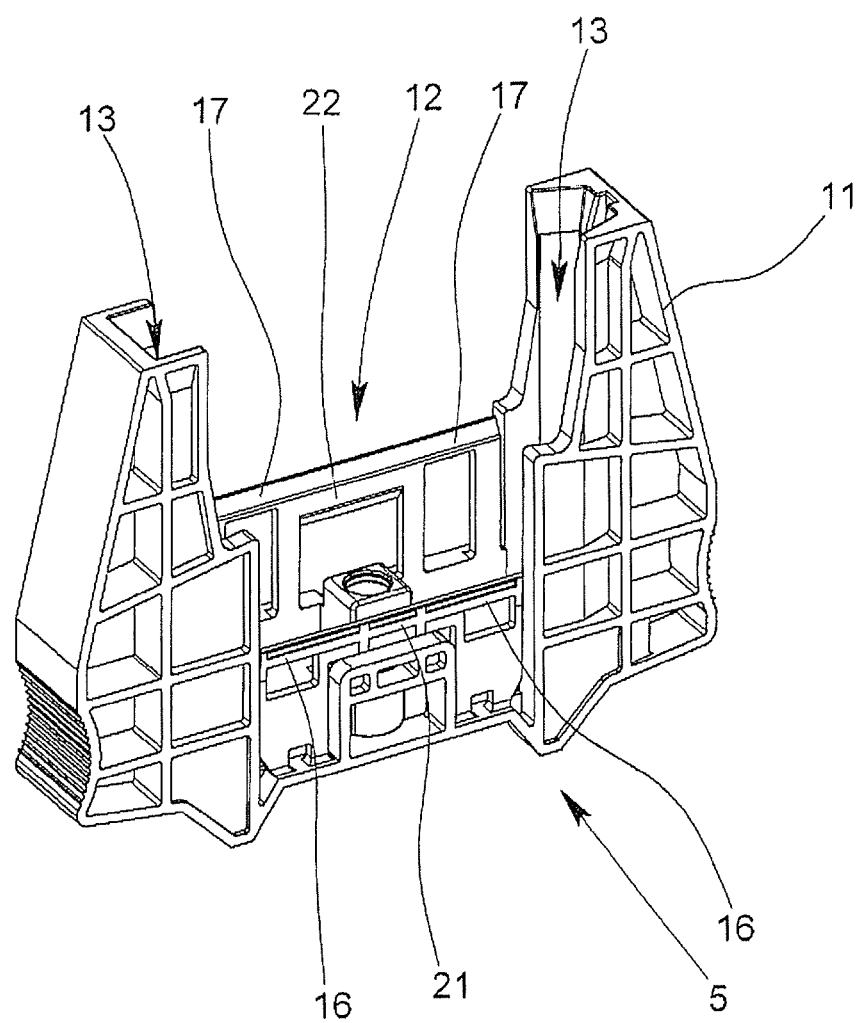
FIG. 2 shows a fastening clamp of the test terminal block as shown in FIG. 1.
Figure 3:
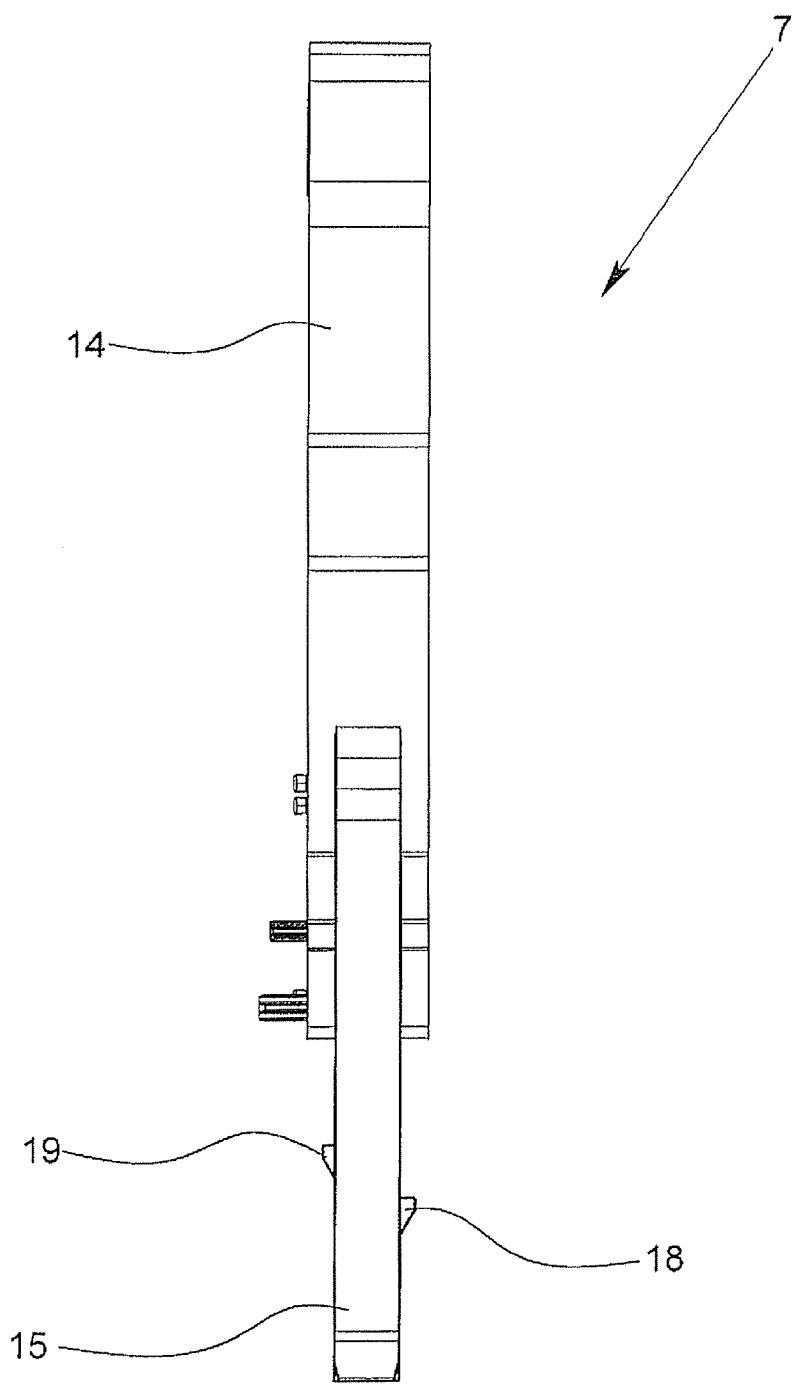
FIG. 3 is a side view of a fastening part of the test terminal block.
Figure 4:
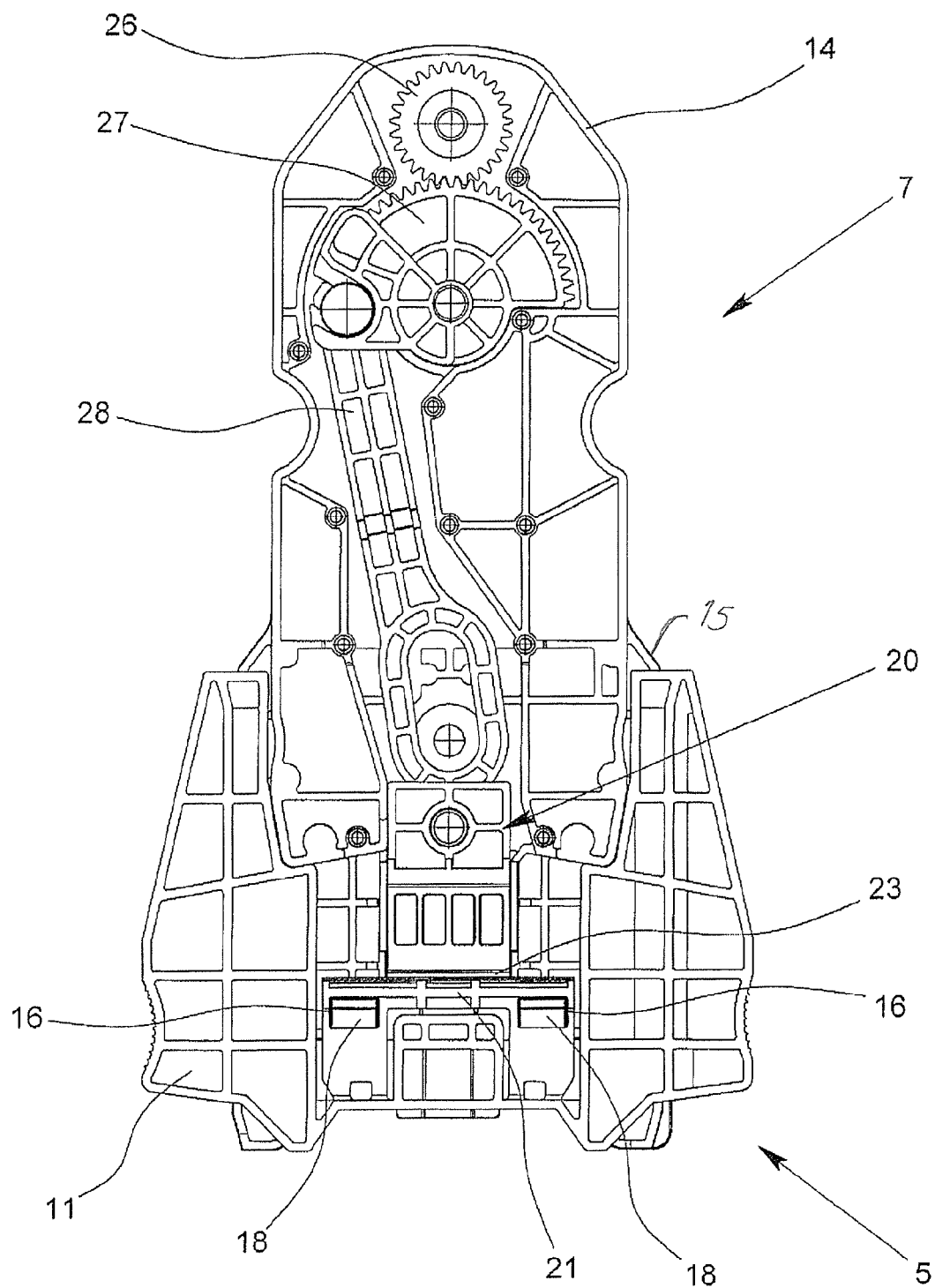
FIG. 4 is a side view of a fastening clamp with a completely plugged-in fastening part.

As is especially apparent from FIGS. 2-4 viewed together, the fastening clamps 5 each have a clamp housing 11 with a receiving section 12 which is open to the top and which is laterally bordered by two guide grooves 13. Corresponding thereto, the housing 14 of the fastening parts 7 has a plug-in section which corresponds to the receiving section 12 and which is formed by two guide segments 15 which can be plugged vertically into the guide grooves 13.

Moreover, it is apparent from FIGS. 2 and 3 that, in the clamp housing 11 of the fastening clamp 5, there are several latch elements which are made as latch clips 16, 17 and on the housing 14 of the fastening part 7 there are a corresponding number of mating latch elements which are made as latch hooks 18, 19 which are engageable in the latch clips 16, 17. The latch clips 16, 17 and the assigned latch hooks 18, 19, in this case, together are able to fix the fastening parts 7 in the fastening clamps 5 in two latching positions which are arranged in succession in the clip-on direction of the fastening parts 7 or of the test plug block 3. In the alignment of the test terminal block 1 according to the figures, the fastening parts 7 and with them also the test plug block 3, can thus be latched in a first, lower latching position and a second upper latching position in the fastening clamps 5 or on the modular terminal block 2.

The two latch clips 16 which are made on the outside of the fastening clamp 5, i.e., on the side of the clamp housing 11 facing away from the modular terminals 4, together with the two latch hooks 18 which are located on the outside of the fastening part 7, i.e., on the side of the housing 14 facing away from the test plugs 6, fix the first latching position. Accordingly, the second latching position is fixed by the two latch clips 17 which have been made on the inside of the clamp housing 11 and by the latch hooks 19 which are located on the inside of the housing 14. To release the locking of the two latching positions, an unlocking element 20 is movably arranged in the housing 14 of the fastening part 7 as is shown separately in FIG. 11 in a perspective from two opposite sides.

Figure 5:
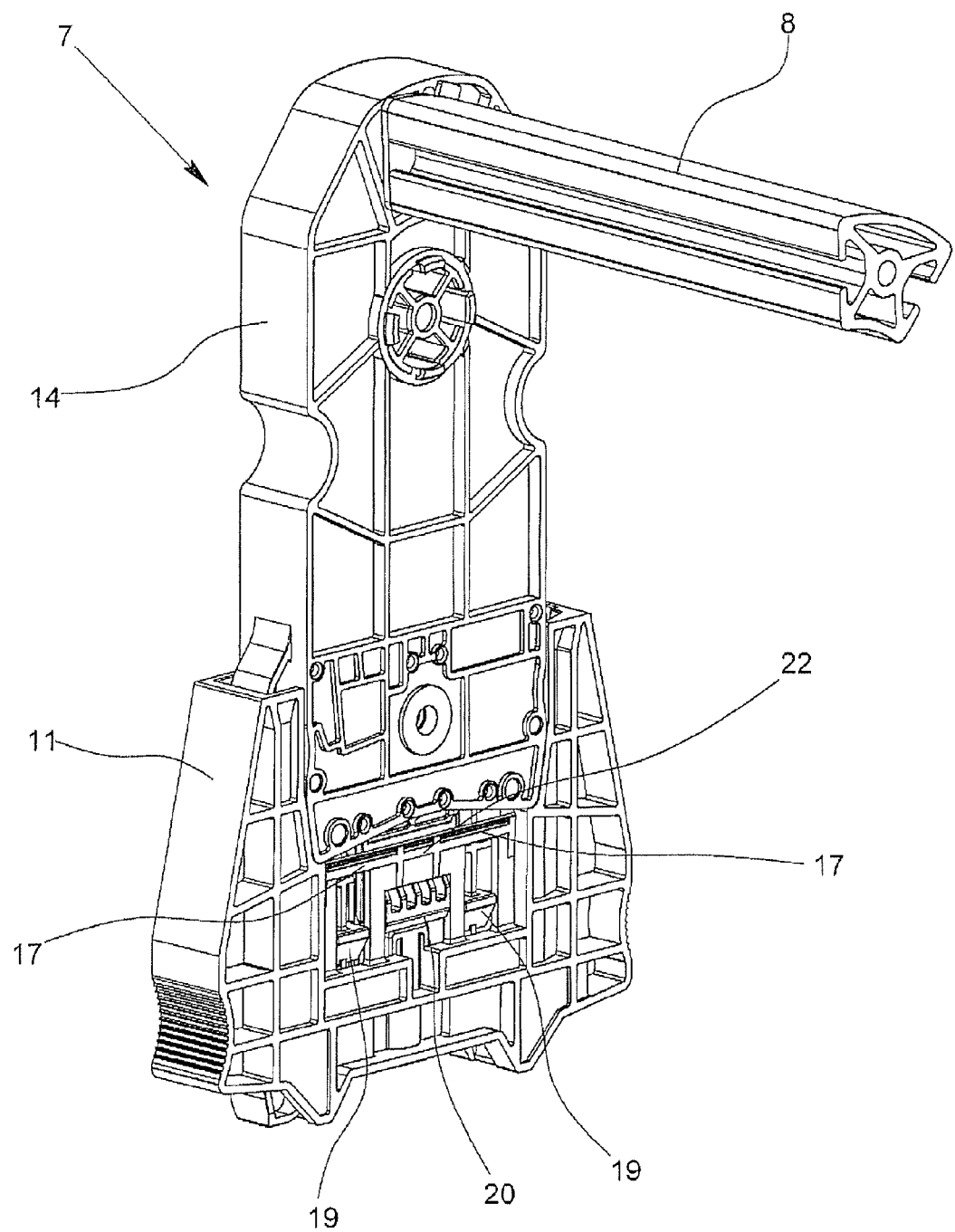
FIG. 5 shows the module composed of the fastening clamp and fastening part according to FIG. 4 in a first latching position, as seen from the inner side.
Figure 6:
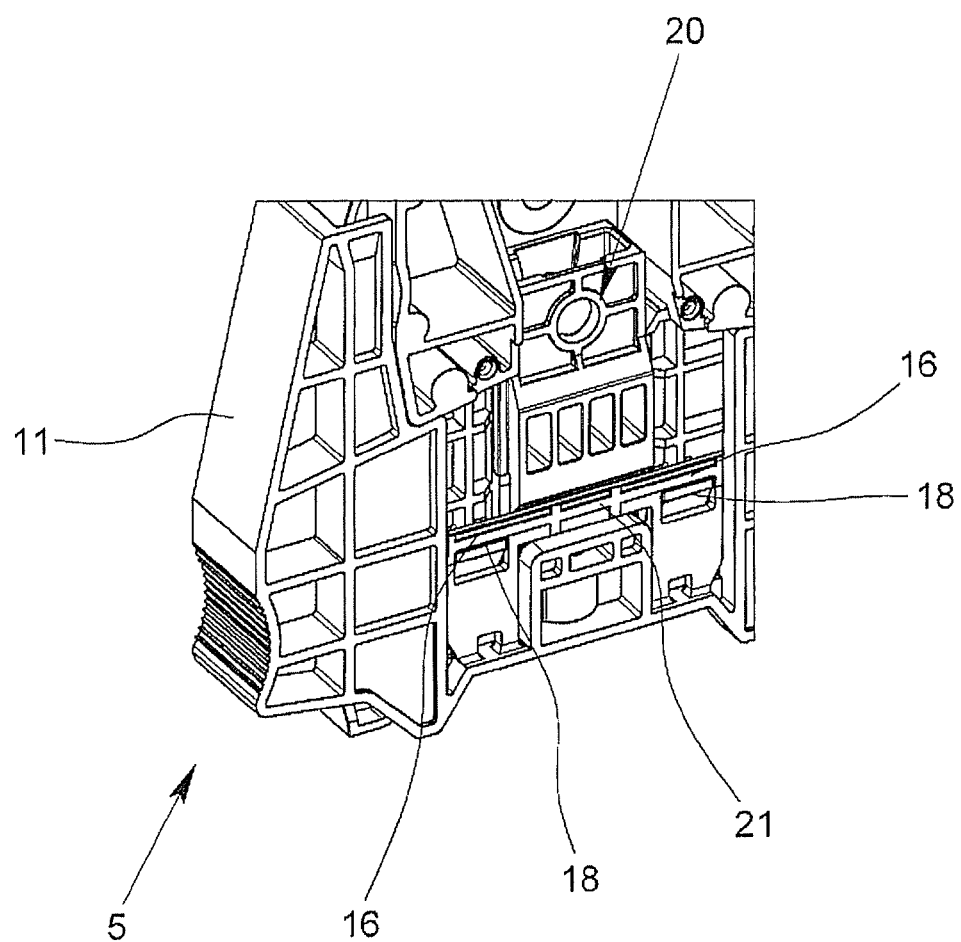
FIG. 6 is a cutout of the module as shown in FIG. 5 as seen from the outer side.
Figure 7:
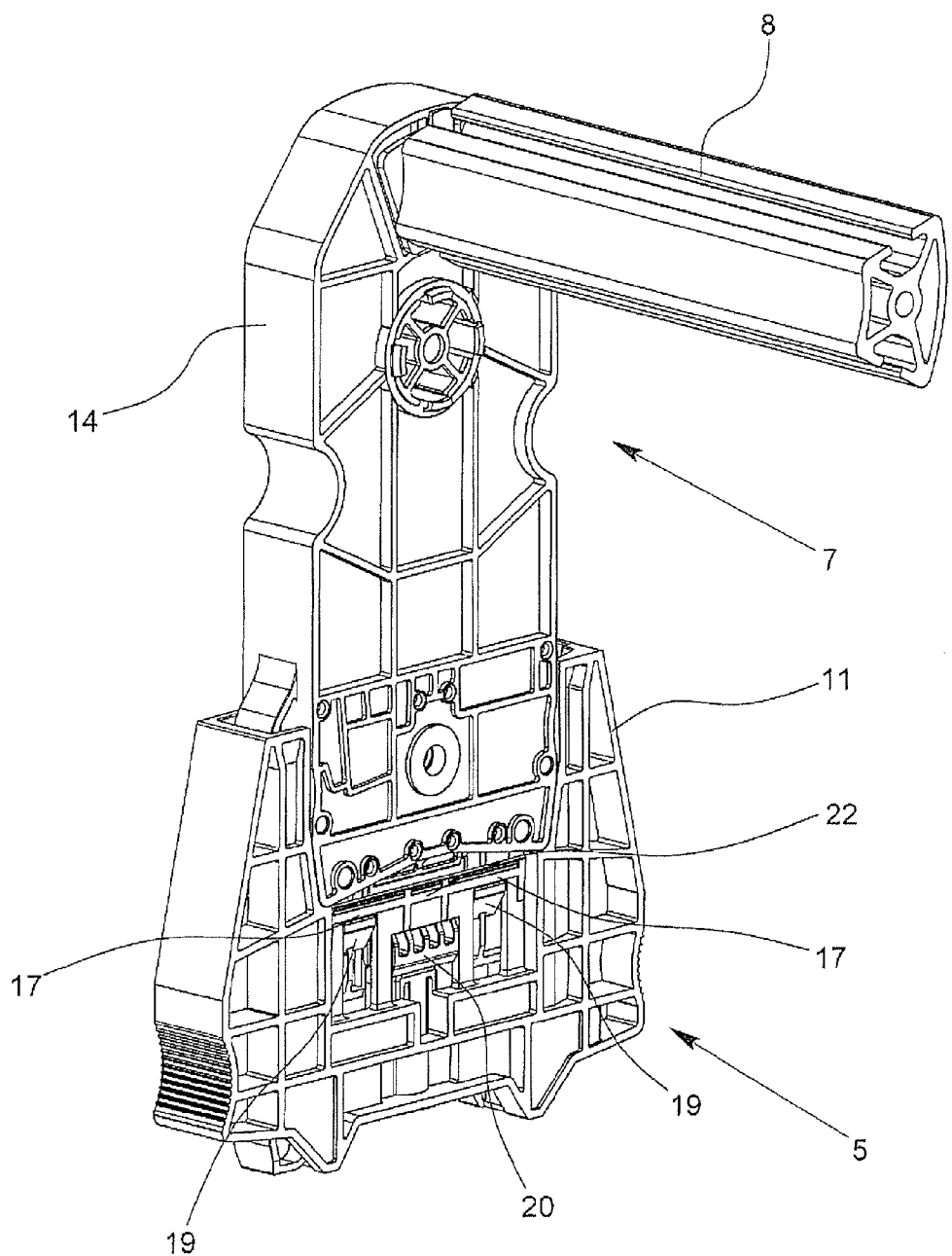
FIG. 7 shows the module according to FIG. 4 in the second latching position, as seen from the inside.
Figure 8:
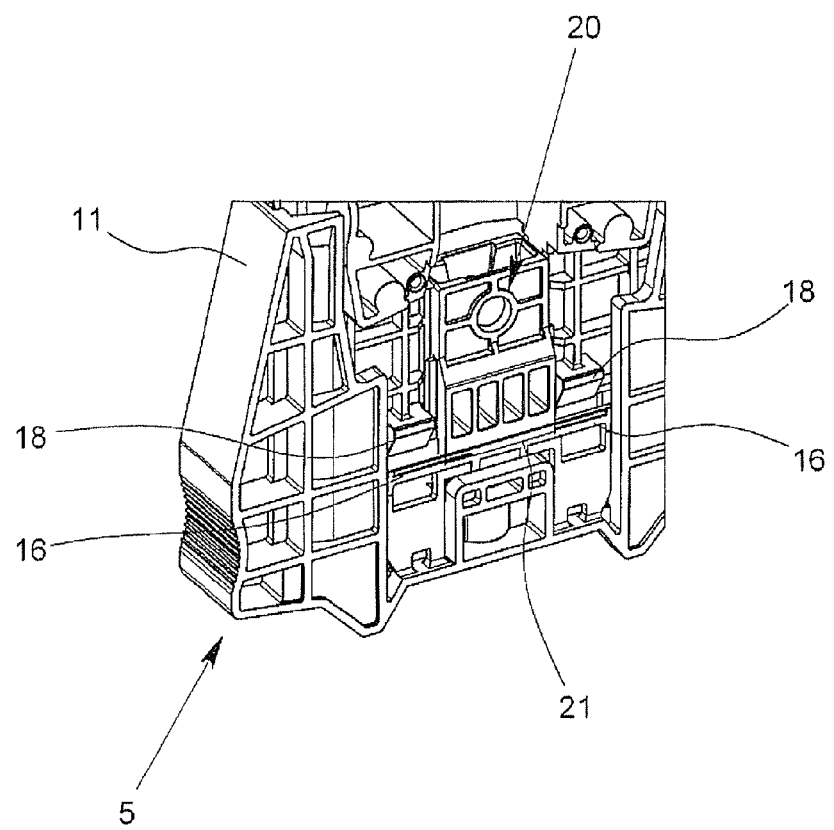
FIG. 8 is a cutout of the module according to FIG. 7, as seen from the outer side.
Figure 9:
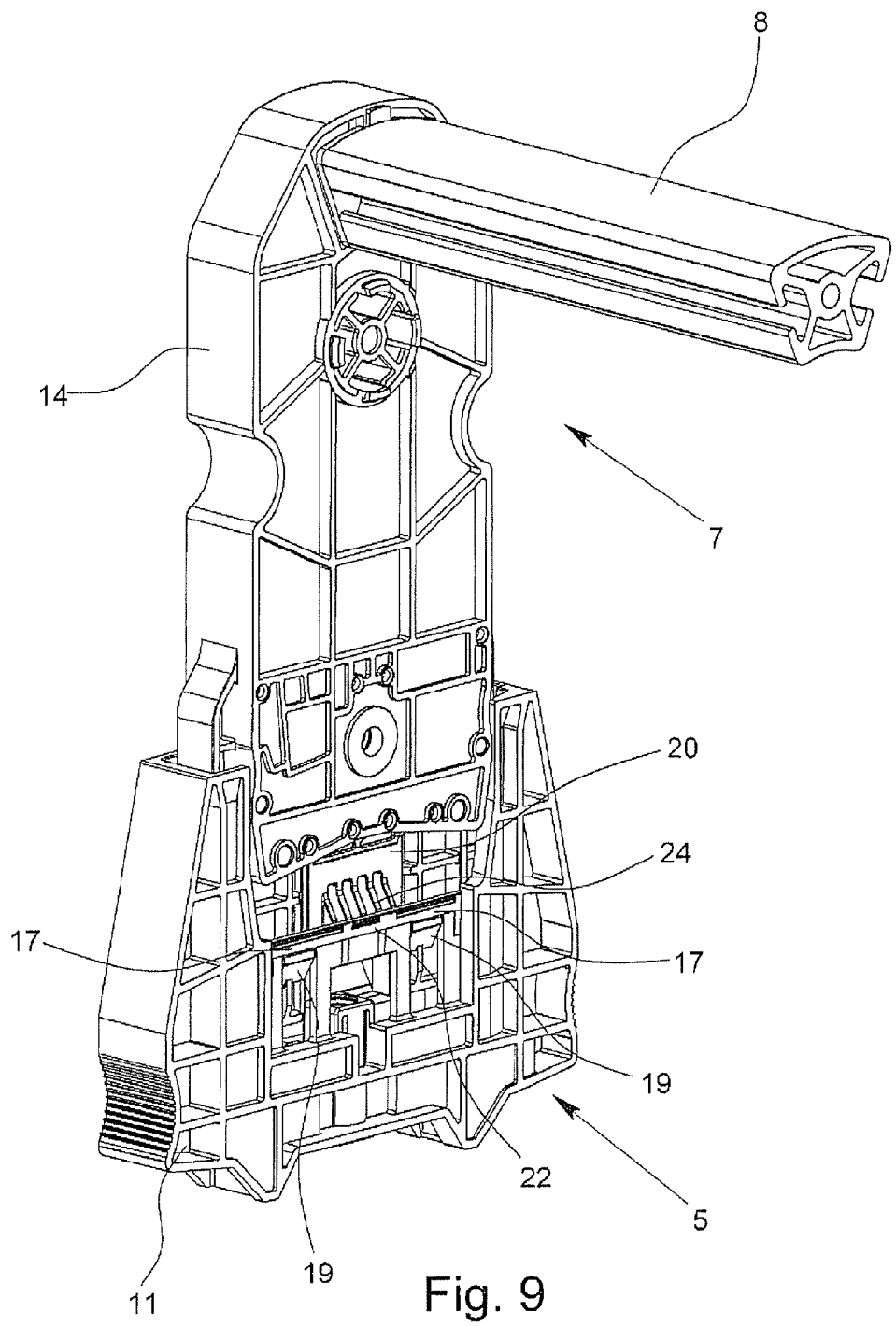
FIG. 9 shows the module according to FIG. 4, with unlocked second latch stage, as seen from the inner side.
Figure 10:
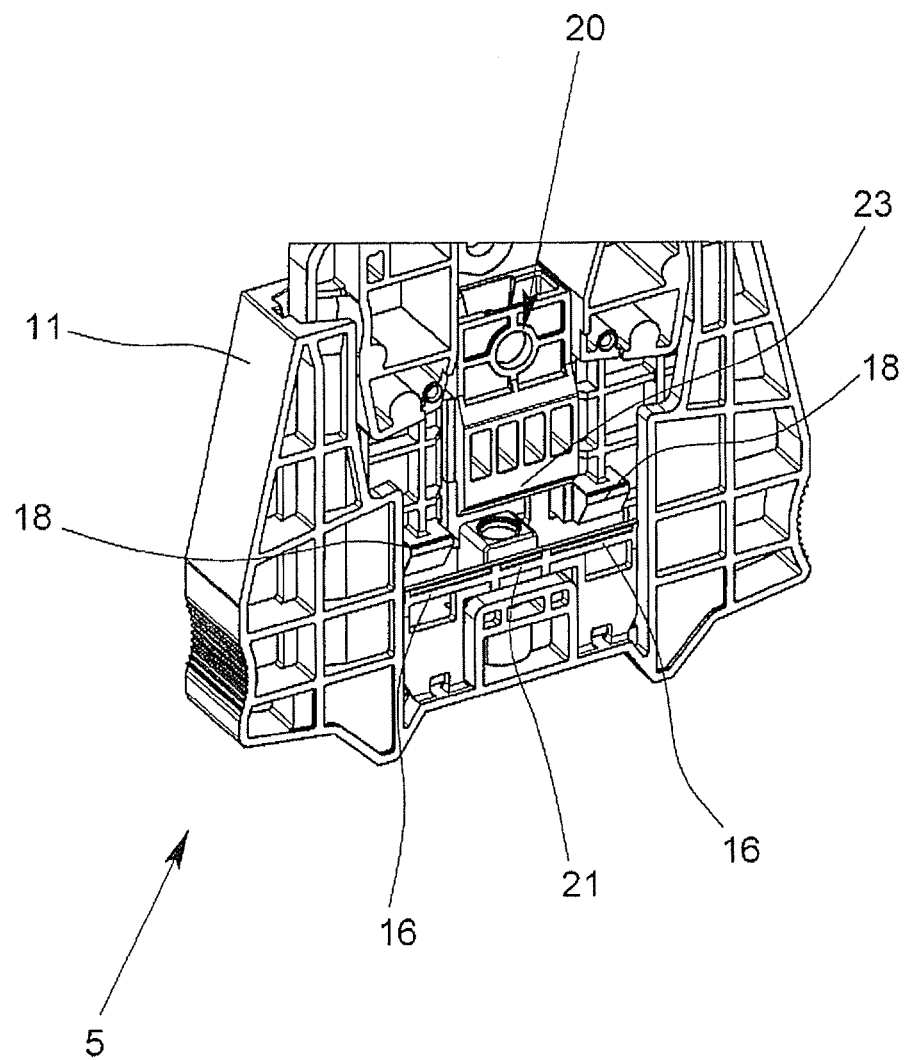
FIG. 10 shows a cutout of the module according to FIG. 9, as seen from the outer side.

The individual steps for unlocking or releasing the two latching positions when the test plug block 3 is withdrawn from the modular terminal block 2 are described below using FIGS. 5 to 10, FIGS. 5, 7 and 9 showing the inside of the module composed of the fastening clamp 5 and fastening part 7, and FIGS. 6, 8 and 10 showing a cutout of the outside of the module. FIGS. 5 and 6 show the state of the module when the first latching position is released, FIGS. 7 and 8 show the state of the module in the second latching position and FIGS. 9 and 10 show the state of the module when the second latching position has been released.

A comparison of FIGS. 5, 7 and 9 shows that a change of the position of the unlocking element 20 is achieved by a rotationally turning the handle 8. In the base state of the test plug block which is shown in FIG. 1, the test plug block 3 is clipped completely onto the modular terminal block 2 and the latch clips 16 in the clamp housing 11 of fastening clamps 5 are latched in the first latching position to the latch hooks 18 located on the housing 14 of the fastening parts 7. Compared to the base state as shown in FIG. 1, in the state shown in FIG. 5 the handle 8 has been turned by a first angle of about 30°. In the situation according to FIG. 7, the handle has been turned by a further 60°, therefore altogether by a second angle of 90°, compared to the base state as shown in FIG. 1. In the position as shown in FIG. 9, finally, the handle 8 has been turned back again by 90°.

Figure 11:
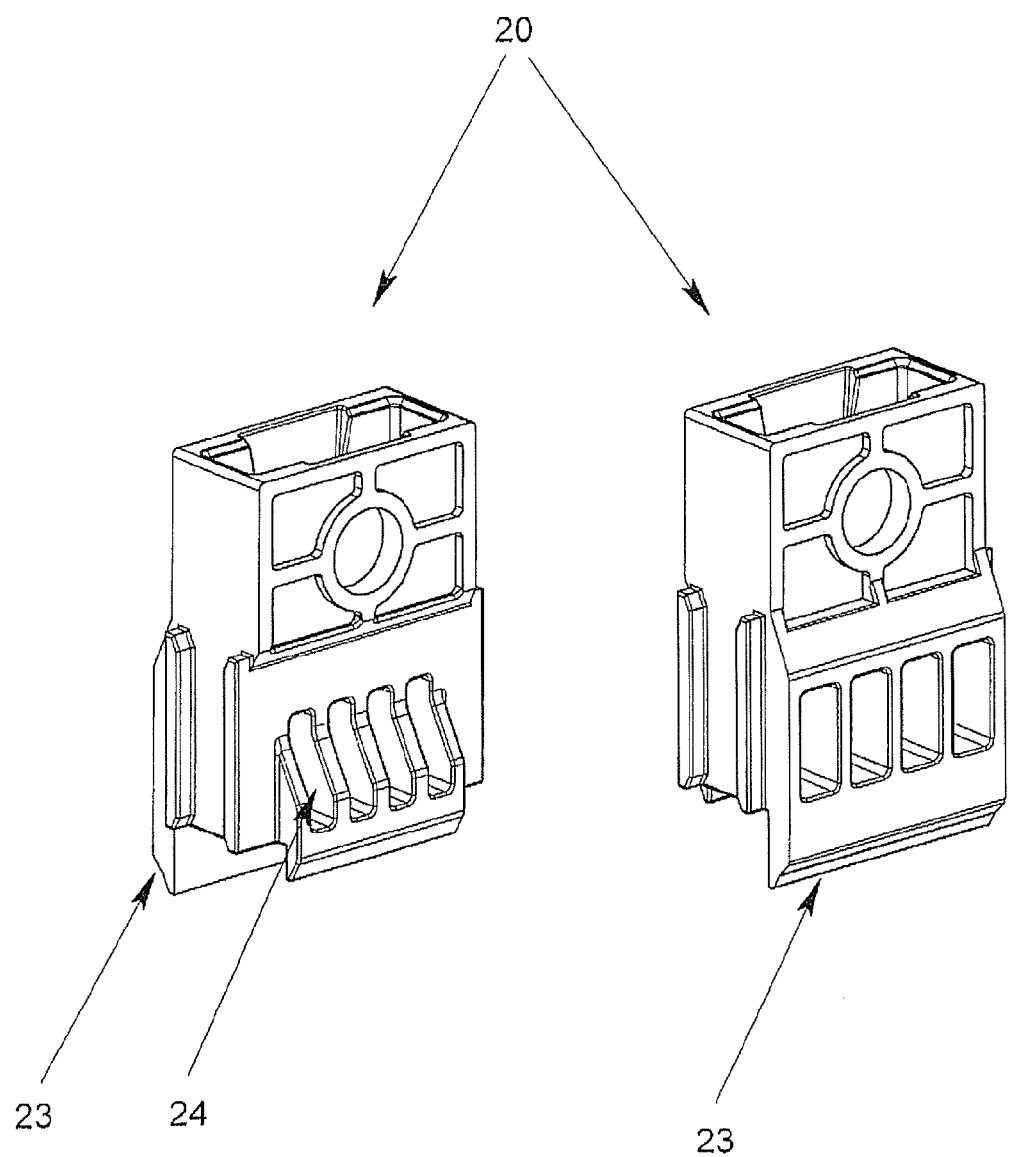
FIG. 11 shows two perspectives of the unlocking element, turned by 180° relative to one another.

As is shown in FIG. 6, the turning of the handle 8 into the first position as shown in FIG. 5 leads to the unlocking element 20 being moved vertically down, as a result of which the locking between the latch clips 16 and latch hooks 18 is released. To do this, the latch clips 16, in the same manner as the latch clips 17 which are located on the other side, are connected to one another via a segment 21 which is deflected by the unlocking element 20. The unlocking element 20 according to FIG. 11 has a respective actuating section 23, 24 on each of the two sides facing the segments 21, 22. FIG. 11 also shows that the first actuating section 23 which is used to unlock the first latching positions tapers in the clip-on direction of the fastening part 7, while the second actuating section 24 which is used to unlock the second latching position tapers opposite the clip-on direction of the fastening part 7. This leads to the actuating section 23 being able to deflect the segment 21 more easily when the unlocking element 20 is being pushed down by turning the handle 8 clockwise.

Since the lower edge of the unlocking element 20 in the first unlocking position already sits on the top of the clamp housing 11 of the fastening clamp 5, further turning of the handle 8 clockwise as shown in FIG. 7 leads to the unlocking element 20 no longer being able to be moved farther down. But since the unlocking element 20 can be moved relative to the housing 14 of the fastening part 7, the housing 14 of the fastening part 7 is repelled from the clamp housing 11 of the fastening clamp 5, i.e., the housing 14 is pushed up when the unlocking element 20 is pushed into a third position by the further rotary motion of the handle 8 relative to the housing 14 of the fastening part 7. The movement of the housing 14 of the fastening part 7 away from the clamp housing 11 of the fastening clamp 5 is limited by the latch hooks 19 engaging the assigned latch clips 17, as is shown in FIG. 7. The fastening part 7 is then located in the second latching position in the fastening clamp 5.

In order to release or unlock the second latching position, the handle 8 according to FIG. 9 is turned back again by 90°. In this way, the unlocking element 20 in the housing 14 of the fastening part 7 is again pushed up, the actuating section 24 of the unlocking element 20 deflecting the segment 22 between the two latch clips 17 so that the locking between the latch clips 17 and the assigned latch hooks 19 is released. The test plug block 3 can be now completely withdrawn from the modular terminal block 2.

Figure 12:
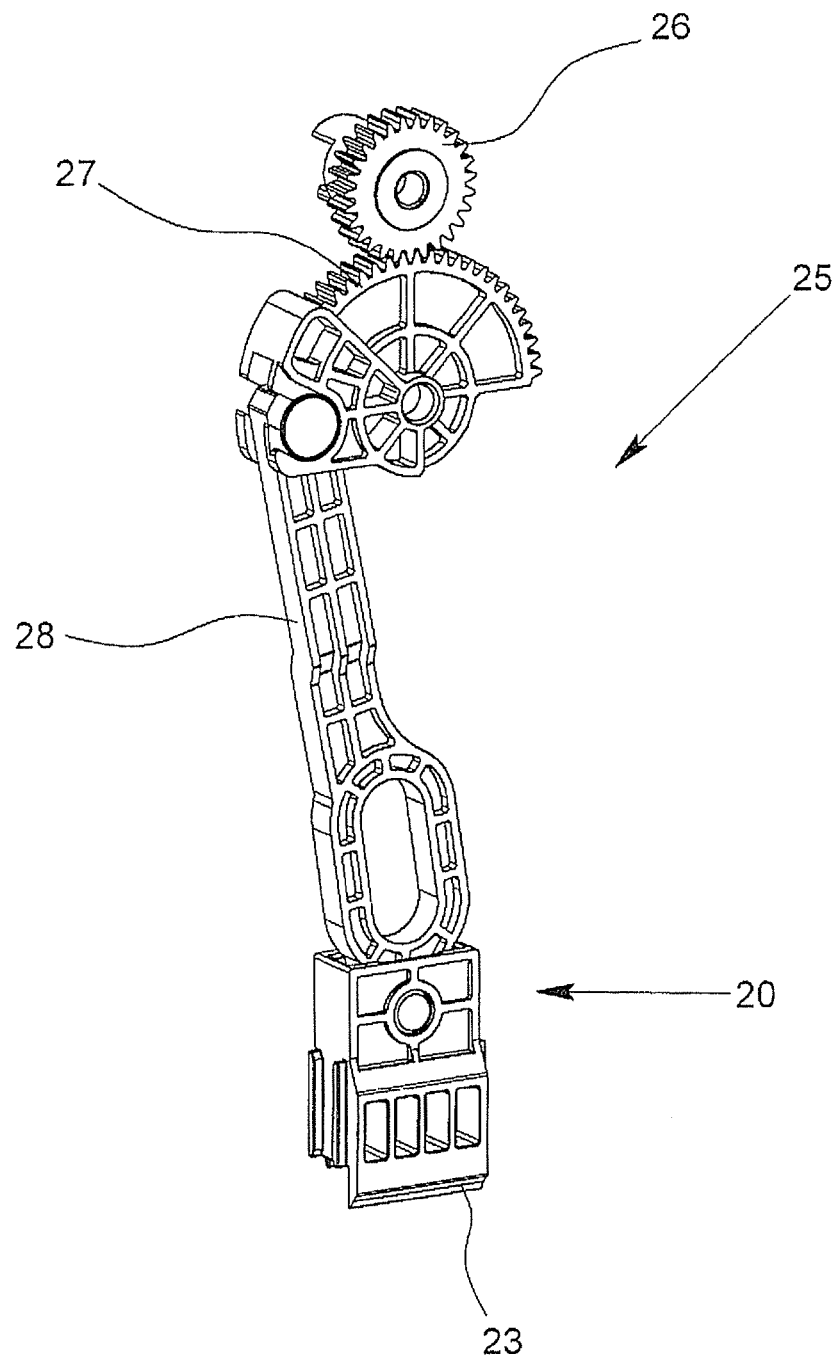
FIG. 12 shows a separate representation of the gearing arrangement with an unlocking element, and which is located in the housing of the fastening part according to FIG. 4, and FIGS. 13a and 13b show two representations of a test plug plugged into an isolation point of a modular terminal in each of two plug-in positions.

In order to convert the rotary motion of the handle 8 into a vertical motion of the unlocking element 20, in the housing 14 of the fastening part 7 there is a gear arrangement 25 (FIG. 4). The gear arrangement 25 as shown in FIG. 12 has two gears 26, 27 and one connecting rod 28 which is connected on its one end to one gear 27 and on its other end to the unlocking element 20. Because the second gear 27 has a greater diameter than the first gear 26 which is connected to the handle 8, advantageous force multiplication is achieved. In this way the force which is to be applied manually by the operator when the test plug block 3 is being pulled out of the modular terminal block 2 need be only relatively small, even if the test terminal block 1 has a plurality of modular terminals 4 and a plurality of test plugs 6.

Figure 13A:
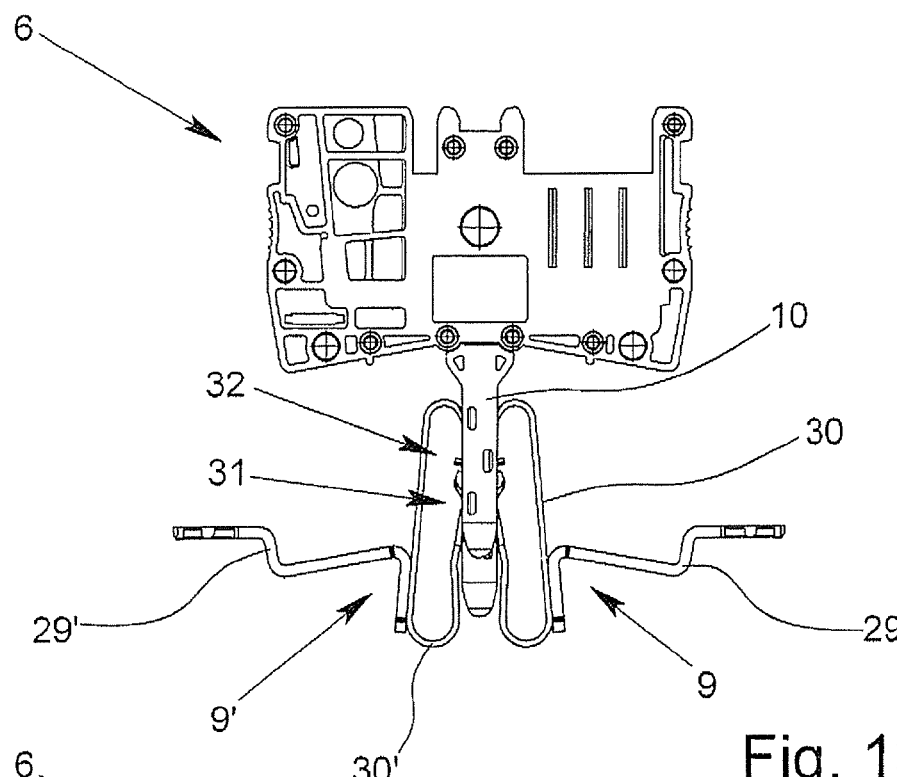
Figure 13B:
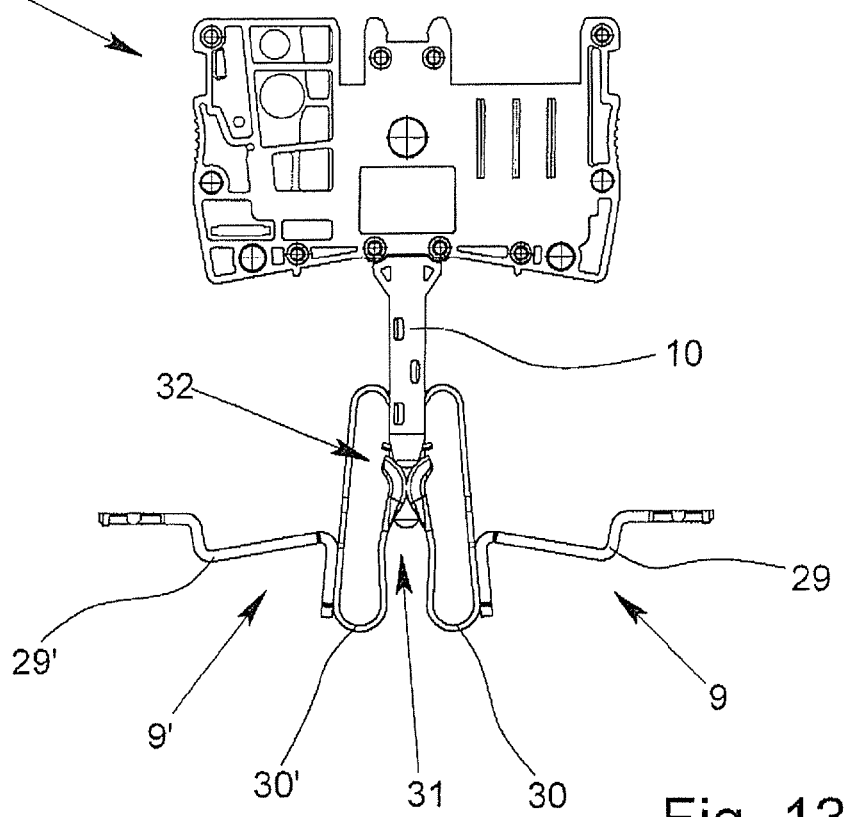

FIGS. 13a and 13b show a test plug 6 with its contact plug 10 plugged into the isolating point of a modular terminal 4, in two different positions, of the modular terminal only the two busbars 9, 9' being shown. The two busbars 9, 9' in the illustrated exemplary embodiment each are formed of two elongated metal strips which are welded or soldered to one another in the transition region and can made of different materials. The one of the metal strips forms the end regions 29, 29' which are assigned to the conductor connecting elements of the modular terminals, while the other of the metal strips forms the second end regions 30, 30' of the busbars 9, 9'. The second end regions 30, 30' are bent such that together they form a first contact region 31 and a second contact region 32 for the contact plug 10 of a test plug 6.

In the completely plugged-in state of the contact plug 10 according to FIG. 13a, the two second end regions 30, 30' are separated from one another by the contact plug 10 so that the two contact regions 31, 32 are disconnected and the electrically conductive connection via the busbars 9, 9' is interrupted. Conversely, if the test plug 10 according to FIG. 13b is pulled somewhat out of the modular terminal 4, the contact plug 10 makes contact with the second end regions 30, 30' only in the second upper contact region 32. Since the contact plug 10 is no longer plugged in the first lower contact region 31, here, the two second end regions 30, 30' of the two busbars 9, 9' make contact with one another so that the conductor connecting elements are connected to one another in an electrically conductive manner via the busbars 9, 9'.

The invention claimed is:

1. A test terminal block, comprising:
   a modular terminal block having a plurality of modular terminals which are located next to one another and a respective fastening clamp on each side of the plurality of modular terminals, and
   a test plug block which is releasably clippable onto the modular terminal block, the test plug block having a plurality of tests plugs which are connected to one another and which has a respective fastening part on each side of the plurality of test plugs, the fastening parts being connected to one another via a handle,
   wherein each of the plurality of modular terminals has two busbars which, together, form an isolating point and each test plug having a contact plug which is pluggable into a respective isolating point, and
   wherein the fastening clamps each having a clamp housing with a receiving section and the two fastening parts each having a fastener housing with a corresponding plug-in section which is pluggable into a respective receiving section,
   wherein the clamp housing of each of the fastening clamps has at least two latching elements and the fastener housing of the fastening parts has at least two corresponding mating latching elements each, the latching elements and the mating latching elements together fixing the fastening clamps in two latching positions of the fastening parts that are located in succession in a clip-on direction of the fastening parts, and
   wherein an unlocking element is movably arranged in the housing of the fastening parts and is movable into a first unlocking position and into a second unlocking position, the locking of the first latching position being released by the unlocking element in the first unlocking position and the locking of the second latching position being released by the unlocking element in the second unlocking position.

2. The test terminal block as claimed in claim 1, wherein a lower edge of the unlocking element sits on the top of the clamp housing of the fastening clamp in the first unlocking position and wherein the unlocking element is movable out of the first unlocking position in the clip-on direction of the fastening parts into a third position, as a result of which the fastener housing is ejected from the clamp housing of the fastening clamp.

3. The test terminal block as claimed in claim 1, wherein latching clips are provided in the clamp housing of the fastening clamps which form latch elements and wherein latch hooks are provided on the fastener housing of the fastening parts which form mating latch elements, at least one of the latch clips for the first latching position and at least one of the latch clips for the second latching position being located on opposite sides of the clamp housing and in different planes in the clip-on direction of the fastening parts.

4. The test terminal block as claimed in claim 3, wherein there are two latch clips on each of the two sides of the clamp housing that are connected to one another via a segment, a respective segment being deflected by the unlocking element to release each of the two latching positions.

5. The test terminal block as claimed in claim 4, wherein each of the unlocking elements has first and second actuating sections on a side facing the respective segment, the first actuating section serving to unlock the first latching position tapering in the clip-on direction of the fastening parts, and the second actuating section serving to unlock the second latching position and tapering opposite the clip-on direction of the fastening parts.

6. The test terminal block as claimed in claim 2, wherein the unlocking elements in the housing of the fastening parts are movable by a rotary motion of the handle.

7. The test terminal block as claimed in claim 6, wherein in the housing of each of the two fastening parts there is a gearing arrangement via which each of the unlocking elements is connected to the handle, each gearing arrangements having gears and a connecting rod, one end of which is connected to one of the gears and another end of which is connect to the respective unlocking element.

8. The test terminal block as claimed in claim 6, wherein turning the handle by an first angle in a first direction is adapted to move the unlocking elements in the housing of the fastening parts out of a base position into the first unlocking position, wherein continued turning of the handle by a second angle in the same direction is adapted to move the unlocking elements into the third position, and wherein turning the handle back into the base position is adapted to move the unlocking elements into the second unlocking position.

9. The test terminal block as claimed in claim 1, wherein the fastening parts are mechanically connectable to the test plugs by means of at least one of latch pins and latch recesses which are arranged on the housing of the fastening parts and by means of the other of at least one of latch recesses and latch pins in a side wall of the housing of the test plugs.

10. The test terminal block as claimed in claim 1, wherein the fastening clamps are mechanically connectable to the modular terminals by means of at least one of latch pins and latch recesses arranged on the fastening clamps and the other of at least one of latch recesses and latch pins in a side wall of the terminal housing of the modular terminals.

11. The test terminal block as claimed in claim 1, wherein the modular terminals each have at least two conductor connection elements and at least two busbars, first end regions of which are assigned to a respective one of the conductor connecting elements and a second end regions of which are bent such that, together, they form two elastic contact regions for accommodating the contact plug of a test plug, wherein the second end regions make contact with one another in the first contact region in the unplugged state of the contact plug so that the two conductor connecting elements are electrically connected to one another via the two busbars, and wherein the two end regions are out of contact with each other in the second contact region so that the second contact region is open, the second contact region being located upstream of the first contact region in the clip-on direction of the contact plug of a test plug.

12. The test terminal block as claimed in claim 1, wherein the contact plugs of the individual test plugs have different lengths.

13. A module formed of a fastening clamp and a fastening part which is connectable to a test plug block, wherein:
   a clamp housing of the fastening clamp has at least two latch elements and
   the housing of the fastening part has at least two corresponding latch elements for mating with at least two latch elements of the clamp housing, so that the latch elements and the corresponding latch elements together are adapted for fixing the fastening part in the fastening clamp in two latching positions, which positions are located in succession in a clip-on direction of the fastening part, and
   wherein an unlocking element is movably arranged in the housing of the fastening part and is movable into a first unlocking position and into a second unlocking position, the locking of the first latching position being released by the unlocking element in the first unlocking position and the locking of the second latching position being released by the unlocking element in the second unlocking position.

14. The module as claimed in claim 13, wherein the latch elements of the clamp housing of the fastening clamp are latch clips and wherein the corresponding latch elements of the housing of the fastening part are mating latch elements, at least one latch clip of the first latching position and the at least one latch clip of the second latching position are located on opposite sides of the clamp housing and in different planes in a clip-on direction of the fastening part.

15. The module as claimed in claim 14, wherein there are two said latch clips on each of two sides of the clamp housing which are connected to one another via a release segment for releasing the two latching positions, one segment at a time being deflected by the unlocking element.

16. The module as claimed in claim 15, wherein the unlocking element has an actuating section on each on sides thereof that face the release segments, a first actuating section being adapted to unlock the first latching position and tapering in the clip-on direction of the fastening part, while a second actuating section being adapted to unlock the second latching position and tapers opposite the clip-on direction of the fastening part.

17. The module as claimed in claim 13, wherein there is a gearing arrangement in the housing of the fastening part via which the unlocking element is connected to a handle which connects two fastening parts to one another, the gearing arrangement having gears and a connecting rod, one end of which is connected to a gear and another end of which is connected to the unlocking element.

* * * * *